(12) United States Patent
Brofman et al.

(10) Patent No.: US 6,270,363 B1
(45) Date of Patent: *Aug. 7, 2001

(54) Z-AXIS COMPRESSIBLE POLYMER WITH FINE METAL MATRIX SUSPENSION

(75) Inventors: Peter J. Brofman; John U. Knickerbocker, both of Hopewell Junction; Sudipta K. Ray, Wappingers Falls; Kathleen A. Stalter, Hopewell Junction, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/315,373

(22) Filed: May 18, 1999

(51) Int. Cl.$^7$ ........................................ H01R 4/58

(52) U.S. Cl. ................................. 439/91; 439/66

(58) Field of Search ............................ 439/66, 91

(56) References Cited

U.S. PATENT DOCUMENTS

| | | | |
|---|---|---|---|
| 4,008,300 | * 2/1977 | Ponn | 439/91 |
| 4,820,376 | * 4/1989 | Lambert et al. | 439/66 |
| 5,041,183 | * 8/1991 | Nakamura et al. | 439/66 |
| 5,174,766 | * 12/1992 | Yoshizawa et al. | 439/91 |
| 5,543,724 | 8/1996 | Christopher | 324/754 |
| 5,618,189 | * 4/1997 | Jin et al. | 439/91 |
| 5,661,042 | 8/1997 | Fang et al. | 438/17 |
| 5,672,979 | 9/1997 | Christopher | 324/754 |
| 5,685,939 | 11/1997 | Wolk et al. | 156/234 |
| 5,686,703 | 11/1997 | Yamaguchi | 174/259 |
| 5,818,700 | * 10/1998 | Purinton | 439/66 |

FOREIGN PATENT DOCUMENTS

| | | |
|---|---|---|
| 0265077A2 | 4/1988 | (EP) . |
| 0708582A1 | 4/1996 | (EP) . |

\* cited by examiner

Primary Examiner—Tulsidas Patel
(74) Attorney, Agent, or Firm—DeLio & Peterson, LLC; Robert Curcio; Ira D. Blecker

(57) ABSTRACT

A compressible interposer comprising an interposer sheet having a plurality of apertures filled with a dielectric material having a substantially uniform suspension of conductive particles therein forming a plurality of conductive sites. Preferably, the number of conductive sites on the interposer are greater in number than the number of contact pads on the electronic components such that precise alignment of the interposer between the electronic components is not required. The apertures of the interposer sheet confine the conductive particles within the dielectric material such that during compression of the interposer between the electronic components, z-axis conductive pathways are formed without shorting in the x and y directions. Preferably, the interposer sheet comprises polyimide. Preferably, the dielectric material comprises polyimide-siloxane. Preferably, the conductive particles have a diameter of about 2 to about 20 $\mu$m and comprise of a material selected from the group consisting of copper, gold, silver, nickel, palladium, platinum, and alloys thereof. The particles may also be coated with an additional conductive material such as solder having a lower melting temperature. Most preferably, the conductive particles comprise solder coated copper particles. The conductive particles are present in an amount of about 30 to about 90 wt. % of the total weight of the conductive particles and the dielectric material.

24 Claims, 2 Drawing Sheets

Z-AXIS COMPRESSIBLE POLYMER WITH FINE METAL MATRIX SUSPENSION

CROSS-REFERENCE TO RELATED APPLICATIONS

Aspects of the present invention are related to subject matter disclosed in co-pending applications entitled "Copper Stud Process For C4 Pads," Ser. No. 09/315,374 filed on even date herewith and assigned to the assignee of the present invention, the subject matter of which is hereby incorporated by reference.

BACKGROUND OF THE INVENTION

1. Field of the Invention

The present invention relates to a novel interposer for use in the assembly of electronic modules which accommodates the camber on the electronic components while providing improved interconnection.

2. Description of Related Art

In the manufacture and assembly of electronic modules, deformities on the substrate surface make interconnection difficult. Typical ceramic substrates exhibit about 25 to about 50 $\mu$m camber as measured from a flat surface of the substrate. When a device with conventional solder ball interconnections is joined to such a substrate, some of the solder balls will not contact the melting pads leading to opens in the circuitry of the module.

One prior art method of providing better interconnection between the device and substrate is through z-axis films (ZAFs). ZAFs are typically anisotropic electrically conductive adhesive films consisting of thousands of conductive particles dispersed throughout the adhesive film. Contact between the conductive particles when compressing the ZAF provide the electrical pathway.

However, as the demands for miniaturization continues, spacing between particles and the precision in spacing between particles becomes increasingly important. Too many particles may lead to shorts while too few particles may not provide an adequate conductive pathway. Prior art techniques of providing conductive particles in an array that will insure particles at every contact pad of the devices is time consuming and therefore costly.

Bearing in mind the problems and deficiencies of the prior art, it is therefore an object of the present invention to provide an apparatus for providing electrical interconnection between electronic components which does not require precise alignment of the interconnections with the contact pads and compensates for substrate camber.

It is another object of the present invention to provide a method and apparatus for assembling an electronic module having improved interconnections.

A further object of the invention is to provide an electronic module which has a substantial reduction in opens between interconnections caused by camber.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an interposer for electrically and mechanically connecting electronic components comprising an interposer sheet having a plurality of apertures; and a dielectric material having a substantially uniform suspension of conductive particles therein, the plurality of apertures substantially filled with the dielectric material.

Preferably, the apertures filled with the dielectric material form a plurality of conductive sites on the interposer sheet such that a number of conductive sites per unit area is greater than a number of contact pads on an electronic component for a same unit area.

Preferably, the dielectric material is selected from the group consisting of polyimide, siloxane, polyimide-siloxane, and bio-based polymeric resins derived from lignin, cellulose, wood oil and crop oil. Preferably, the conductive particles have a diameter of about 2 to about 20 $\mu$m and is a material selected from the group consisting of copper, gold, silver, nickel, palladium, platinum, and alloys thereof. In an alternative embodiment, the conductive particles may be coated with a material selected from the group consisting of tin, zinc, indium, bismuth, lead and antimony.

The present invention is directed to, in another aspect, a method of assembling an electronic module comprising the steps of (a) providing a first electronic component having one or more contact pads; (b) providing a second electronic component having one or more corresponding contact pads; (c) providing an interposer comprising a compressible interposer sheet having a plurality of apertures greater in number than a number of contact pads; and a dielectric material having a substantially uniform suspension of conductive particles therein, the plurality of apertures substantially filled with the dielectric material forming a plurality of conductive sites; (d) aligning the interposer between the first and second electronic components such that at least one conductive site is aligned between a contact pad on the first electronic component and a corresponding contact pad on the second electronic component; and (e) compressing the first and second electronic components and the interposer such that the conductive particles within the at least one conductive site meet in a substantially z-axis direction to provide interconnection between a contact pad on the first electronic component and a corresponding contact pad on the second electronic component. The method may further include step (f) heating the electronic assembly to bond the interposer to the first and second electronic components.

Preferably, in step (c) the dielectric material is selected from the group consisting of polyimide, siloxane, polyimide-siloxane, and bio-based polymeric resins derived from lignin, cellulose, wood oil and crop oil. Preferably, in step (c) the conductive particles are selected from the group consisting of copper, gold, silver, nickel, palladium, platinum, and alloys thereof. In step (c), the conductive particles may be coated with a material selected from the group consisting of tin, zinc, indium, bismuth, lead and antimony.

Preferably, in step (c) the conductive particles are present in an amount of about 30 to about 90 wt. % of the total weight of the conductive particles and the dielectric material.

The present invention is directed to, in yet another aspect, an electronic module comprising a first electronic component having at least one contact pad; a second electronic component having corresponding contact pads; and an interposer compressed between the first and second electronic components, the interposer comprising an interposer sheet having a plurality of apertures, the apertures substantially filled with a dielectric material having a plurality of conductive particles substantially uniformly suspended within the dielectric material forming a plurality of conductive sites wherein at least one conductive site electrically interconnects a contact pad on the first electronic component to a corresponding contact pad on the second electronic component, the particles within the conductive site being joined together.

Preferably, more than one conductive site is aligned between a contact pad on the first electronic component and a corresponding contact pad on the second electronic component and the particles within the conductive site are contacted together in a substantially z-axis direction to provide interconnection between the first and second electronic components.

Preferably, the dielectric material comprises a material selected from the group consisting of polyimide, siloxane, polyimide-siloxane, and bio-based polymeric resins derived from lignin, cellulose, wood oil and crop oil. Preferably, the conductive particles comprise a material selected from the group consisting of copper, gold, silver, nickel, palladium, platinum, and alloys thereof. In an alternative embodiment, the conductive particles may be coated with a material selected from the group consisting of tin, zinc, indium, bismuth, lead and antimony. Most preferably, the conductive particles are present in an amount of about 30 to about 90 wt. % of the total weight of the conductive particles and the dielectric material.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
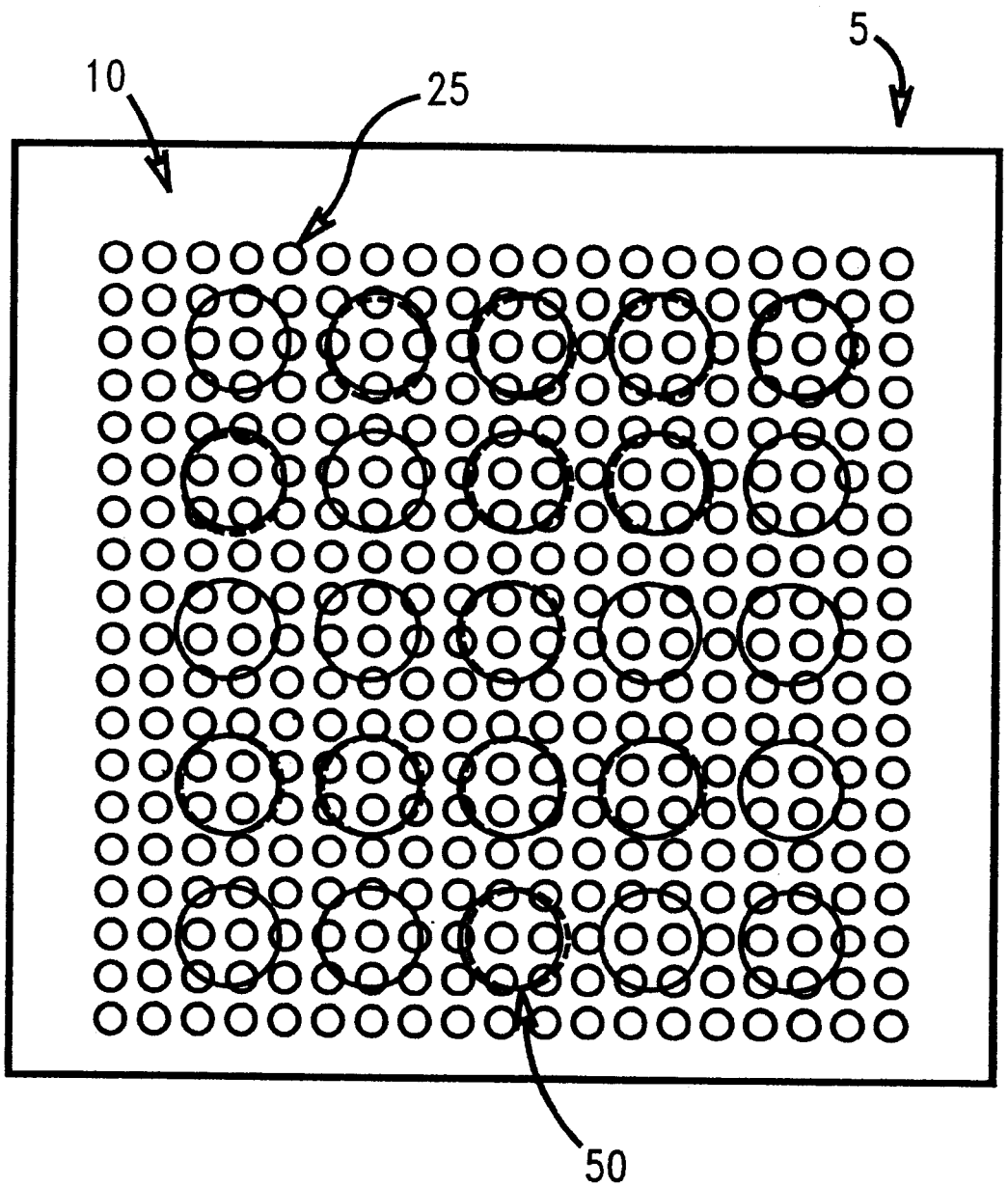
FIG. 1 is a top plan view of an interposer of the present invention.

In describing the preferred embodiment of the present invention, reference will be made herein to FIGS. 1–2B of the drawings in which like numerals refer to like features of the invention. Features of the invention are not necessarily shown to scale in the drawings.

The present invention compensates for the camber found on electronic components by using a compressible interposer for interconnecting electronic components when forming an electronic module. The interposer of the present invention has a plurality of apertures filled with a dielectric material having a substantially uniform suspension of conductive particles therein. Upon compression of the interposer, the conductive particles contact each other to provide electrical interconnection between contact pads on the electronic components in a substantially z-axis direction.

FIG. 1 is a top plan view of an interposer 5 of the present invention. Interposer 5 comprises an interposer sheet 10 having a plurality of apertures 25. Interposer sheet 10 is preferably, a compliant, compressible, non-conductive material and may be a dielectric. Where necessary, interposer sheet 10 may comprise an adhesive epoxy film to improve the fatigue life of the electronic module. The use of interposer 5 eliminates the need for a separate underfill material to enhance the fatigue life of the interconnections. Suitable materials may be of a compressible nature, have dielectric properties, and may also be a curable adhesive having a thickness of about 50 to about 500 μm. Preferably, interposer sheet 10 comprises polyimide, tetrafluoroethylene or Kapton™.

The apertures 25 are formed, preferably, by laser ablation although other methods, such as mechanical punching, may be contemplated. The pitch of apertures 25 is arranged with a pitch equal to and, preferably, smaller than that of the contact pads, most preferably about 50 to about 250 μm pitch. Apertures 25 are substantially filled with a dielectric material having a substantially uniform suspension of conductive particles. Upon compression of interposer 5 within an electronic module, the conductive particles contact together in a substantially z-axis direction providing interconnection between two contact pads. This aspect of the invention is discussed in further detail below. The preformed apertures 25 serve to confine the dielectric material to the regions of the corresponding contact pads which permits use of much higher concentration of the conductive particles than prior art anisotropic z-axis films. A higher concentration of conductive particles provide higher conduction paths.

As seen in FIG. 1, contact pads 50 may be positioned with respect to interposer 5 such that at least one z-axis path will wholly contact a pad on a first electronic component and the corresponding pad on a second electronic component. Preferably, there are more than one z-axis paths for each set of corresponding contact pads. The pitch of apertures 25 reduces the need for perfect alignment of interposer 5 with the contact pads on the electronic components. Without the need for perfect alignment, manufacturing processes require less time thus, reducing costs.

Figure 2A:
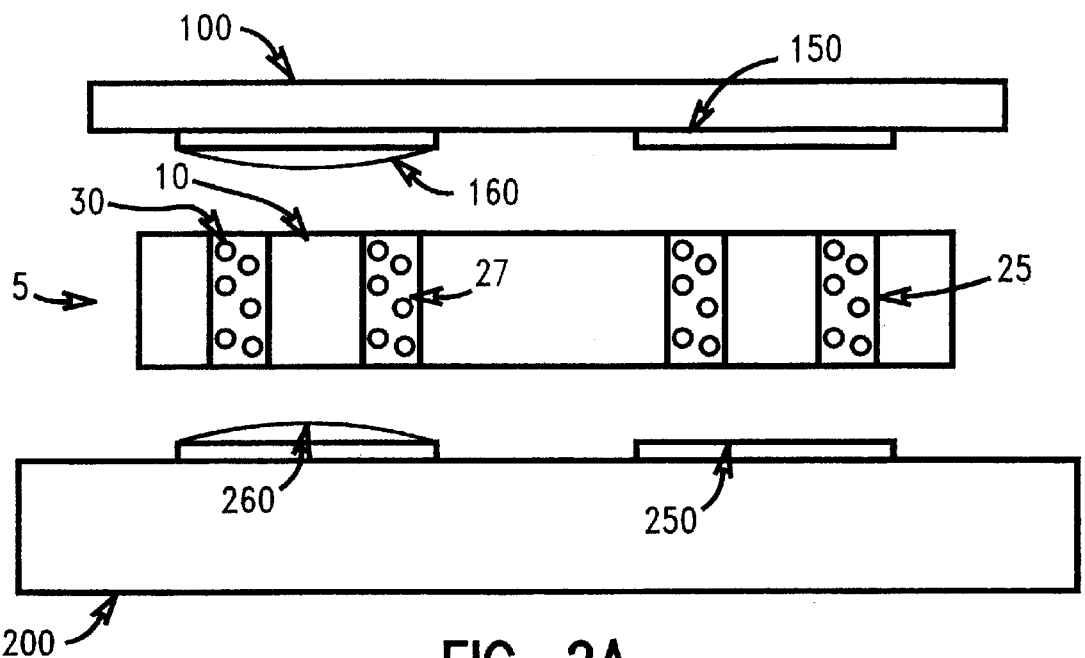
FIGS. 2A and 2B are side views of an interposer of the present invention as used in forming an electronic module.
Figure 2B:
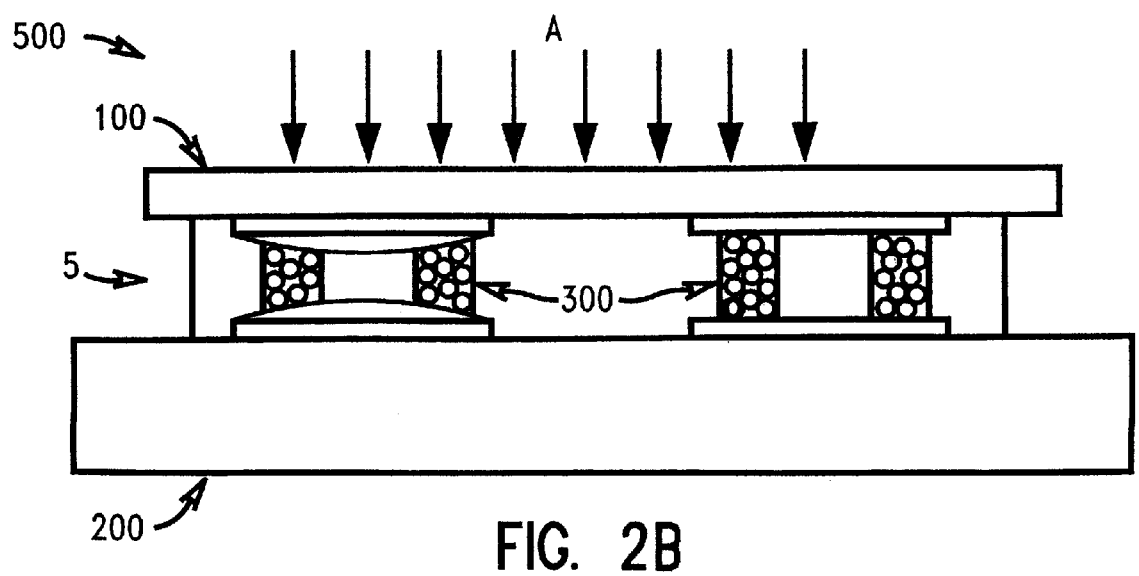

In FIGS. 2A and 2B, apertures 25 may be substantially filled with a dielectric material 27 having a substantially uniform suspension of conductive particles 30. Apertures 25 may be filled with the dielectric material 27 according to conventional paste/fill technology. An example would be "doctor blading" the dielectric material 27 across interposer sheet 10 by placing interposer sheet 10 on a release layer.

Dielectric material 27 is preferably a polymeric material which may be cured upon heating, at a temperature of about 150 to about 250° C., or upon cooling for most thermoset materials. It should have good adhesion to the surfaces of the electronic components with good mechanical properties. Desirable physical properties include a low coefficient of thermal expansion with a high modulus which accommodates the thermal mismatch strains between the electronic components. Preferably, the viscosity of dielectric material 27 is about 50,000 to about 500,000 centipoise although have a rheology suitable for printing and screening features as is known in the art.

More preferably, dielectric material 27 is selected from the group consisting of polyimide, siloxane, polyimide-siloxane, and bio-based polymeric resins derived from lignin, cellulose, wood oil and crop oil. Most preferably, dielectric material 27 comprises polyimide-siloxane due to its demonstrated effectiveness and, in particular, it is cured upon cooling.

Dielectric material 27 preferably has about 30 to about 90 wt. % of conductive particles 30 substantially uniformly suspended throughout dielectric material 27. Since the dielectric material and conductive particles are confined within the apertures 25 of interposer sheet 10, a high filler weight percent does not pose any problems with anisotropy. Preferably, conductive particles 30 have a diameter of about 2 to about 20 µm.

Conductive particles 30 may preferably comprise of a material selected from the group consisting of copper, gold, silver, nickel, palladium, platinum, and alloys thereof. The particles may be made from known methods in the art or commercially available. Conductive particles 30 may also be coated with an electrically conductive coating, preferably the coating having a lower melting temperature than the particle itself. Preferably, the coating comprises a low melting temperature solder or may comprise a material selected from the group consisting of tin, zinc, indium, bismuth, lead and antimony.

In a preferred embodiment, the conductive particles comprise a copper powder having a size distribution of about 2 to about 8 µm in diameter which may be obtained from Degussa Corporation of South Plainfield, N.J. More preferably, the copper powder has a tin plating of about 0.3 to about 0.5 µm thick. The tin plating is performed on cleaned copper powder in an immersion tin plating solution available from Shipley of Newton, Massachusetts as Tinposit™ LT-34.

After the plating and rinsing the tin plated copper powder, the particles are immediately mixed with a conventional no-clean flux to prevent oxidation. The tin plated copper powder is formulated with a dielectric material by preferably mixing with polyimide-siloxane along with suitable solvents. To insure uniform dispersion of the ingredients, the mixture is preferably processed in a threeroll shear mill. The viscosity of the polyimide-siloxane is preferably controlled by adjusting the amount of the tin plated copper powder such that the apertures 2 of interposer sheet 10 may be easily and substantially filled. Preferably, the viscosity of the polyimide-siloxane with the substantially uniform suspension of tin-plated copper powder is preferably about 50,000 to about 500,000 centipoise.

Once the dielectric material 27 containing conductive particles 30 is prepared, it is preferably "doctor-bladed" into the apertures 25 of interposer sheet 10 to form interposer 5. Referring back to FIGS. 2A and 2B, interposer 5 is placed between two electronic components, for example chip 100 and substrate 200. Chip 100 may have a plurality of chip contact pads 150 which may have solder bumps 160 thereon. Substrate 200 may also have a plurality of substrate contact pads 250 which may have solder bumps 260 thereon. Since the aperture pitch of interposer 5 is considerably higher than the number of contact pads on either electronic component, there is no need for perfect alignment of the interposer with the contact pads.

Pressure in the direction of arrow A is applied to chip 100 and substrate 200 such that interposer 5 is compressed between the electronic components at about 5 to about 50 psi. Upon compression, the conductive particles 30 within apertures 25 come into contact with each other and provide substantially z-axis connections 300 which interconnect the contact pads of chip 100 and substrate 200. The contact pads and solder bumps on the surface of chip 100 and substrate 200 protrude slightly from a surface of the chip and substrate. When interposer 5 is compressed, the protrusions of the contact pads and solder bumps compress interposer 5 to a further extent such that z-axis connections 300 are more likely to form to provide interconnection. Dielectric material 27 and interposer sheet 10 may also be selected to provide mechanical interconnection as well in the form of an adhesive.

Heat and continued pressure may be applied to electronic module 500 for a time and temperature to cure interposer sheet 10. Even more preferably, the heat applied may also be sufficient to simultaneously fuse conductive particles 30 to provide substantially permanent z-axis connections 300. The fused conductive particles provide a metallurgical bond to maintain the electrically conductive path along the z-axis connection even when there is delamination of the interposer 5 to the electronic components. Furthermore, during subsequent assembly to a card or board, the z-axis connections do not re-melt and cause volume expansion of the conductive particles. Such re-melting causes z-axis stresses which may lead to delamination.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An interposer for electrically and mechanically connecting electronic components comprising:
   an interposer sheet having a plurality of apertures, said sheet comprising an uncured dielectric adhesive; and,
   a dielectric material having a substantially uniform suspension of conductive particles therein, along a z-axis direction, said plurality of apertures substantially filled with said dielectric material, said dielectric material comprising an uncured thermoplastic adhesive, said conductive particles adapted for fusing to provide a metallurgical bond to maintain an electrically conductive path along said z-axis even after delaminating of said interposer.

2. The interposer of claim 1 wherein said apertures filled with said dielectric material form a plurality of conductive sites on said interposer sheet such that a number of said conductive sites per unit area is greater than a number of contact pads on each of said electronic components for a same unit area.

3. The interposer of claim 1 wherein said interposer sheet comprises a compressible material.

4. The interposer of claim 1 wherein said interposer sheet comprises a dielectric material.

5. The compressible matrix of claim 1 wherein said sheet comprises polyimide.

6. The compressible matrix of claim 1 wherein said dielectric material comprises an uncured thermoplastic adhesive.

7. The compressible matrix of claim 1 wherein said dielectric material is selected from the group consisting of polyimide, siloxane, polyimide-siloxane, and bio-based polymeric resins derived from lignin, cellulose, wood oil and crop oil.

8. The compressible matrix of claim 1 wherein said conductive particles have a diameter of about 2 to about 20 µm.

9. The compressible matrix of claim 1 wherein said conductive particles comprise a material selected from the group consisting of copper, gold, silver, nickel, palladium, platinum, and alloys thereof.

10. The compressible matrix of claim 1 wherein said conductive particles are coated with a material selected from the group consisting of tin, zinc, indium, bismuth, lead and antimony.

11. A method of assembling an electronic module comprising the steps of:

(a) providing a first electronic component having one or more contact pads;

(b) providing a second electronic component having one or more corresponding contact pads;

(c) providing an interposer comprising:
   a compressible uncured interposer sheet having a plurality of apertures greater in number than a number of contact pads; and
   a dielectric material having a substantially uniform suspension of conductive particles therein, said plurality of apertures substantially filled with said dielectric material forming a plurality of conductive sites;

(d) aligning said interposer between said first and second electronic components such that at least one conductive site is aligned between a contact pad on said first electronic component and a corresponding contact pad on said second electronic component;

(e) compressing said first and second electronic components and said interposer such that the conductive particles within the at least one conductive site meet in a substantially z-axis direction to provide interconnection between a contact pad on said first electronic component and a corresponding contact pad on said second electronic component; and, (f) applying heat during said compressing step for a time and temperature to cure said interposer and simultaneously fuse said conductive particles providing a metallurgical bond to maintain conduction along said z-axis direction.

12. The method of claim 11 further including the step:

(f) heating said electronic assembly to bond said interposer to said first and second electronic components.

13. The method of claim 11 further including the step of further processing said electronic module during which the joined conductive particles are nonmelting.

14. The method of claim 11 wherein in step (c) said dielectric material is selected from the group consisting of polyimide, siloxane, polyimide-siloxane, and bio-based polymeric resins derived from lignin, cellulose, wood oil and crop oil.

15. The method of claim 11 wherein in step (c) the conductive particles are selected from the group consisting of copper, gold, silver, nickel, palladium, platinum, and alloys thereof.

16. The method of claim 15 wherein in step (c) the conductive particles are coated with a material selected from the group consisting of tin, zinc, indium, bismuth, lead and antimony.

17. The method of claim 11 wherein in step (c) the conductive particles are present in an amount of about 30 to about 90 wt. % of the total weight of said conductive particles and said dielectric material.

18. An electronic module comprising:
   a first electronic component having at least one contact pad;
   a second electronic component having corresponding contact pads; and
   an interposer compressed between said first and second electronic components, said interposer comprising an interposer sheet having a plurality of apertures in a z-axis direction, said apertures substantially filled with a dielectric material having a plurality of conductive particles within said dielectric material forming a plurality of conductive sites wherein at least one conductive site electrically interconnects a contact pad on said first electronic component to a corresponding contact pad on said second electronic component, said interposer including an uncured thermoplastic adhesive, said conductive particles, adapted to be fused simultaneously with curing of said interposer, to provide a metallurgical bond to maintain an electrically conductive path along said z-axis even after delaminating of said interposer.

19. The electronic module of claim 18 wherein more than one conductive site is aligned between a contact pad on said first electronic component and a corresponding contact pad on said second electronic component and the particles within the conductive site are contacted together in substantially said z-axis direction to provide interconnection between said first and second electronic components.

20. The electronic module of claim 18 wherein said interposer sheet comprises a dielectric material.

21. The electronic module of claim 18 wherein said dielectric material comprises a material selected from the group consisting of polyimide, siloxane, polyimide-siloxane, and bio-based polymeric resins derived from lignin, cellulose, wood oil and crop oil.

22. The electronic module of claim 18 wherein said conductive particles comprise a material selected from the group consisting of copper, gold, silver, nickel, palladium, platinum, and alloys thereof.

23. The electronic module of claim 22 wherein said conductive particles are coated with a material selected from the group consisting of tin, zinc, indium, bismuth, lead and antimony.

24. The electronic module of claim 18 wherein said conductive particles are present in an amount of about 30 to about 90 wt. % of the total weight of said conductive particles and said dielectric material.

* * * * *